(12) United States Patent
Price et al.

(10) Patent No.: US 7,812,258 B2
(45) Date of Patent: Oct. 12, 2010

(54) FLEX CABLE WITH BIASED NEUTRAL AXIS

(75) Inventors: Kirk B. Price, San Jose, CA (US); Jr-Yi Shen, Sunnyvale, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 336 days.

(21) Appl. No.: 12/108,055

(22) Filed: Apr. 23, 2008

(65) Prior Publication Data

US 2009/0266578 A1 Oct. 29, 2009

(51) Int. Cl.
*H01B 7/00* (2006.01)
(52) U.S. Cl. .............................. 174/110 R; 174/117 R; 174/117 F; 174/117 FF
(58) Field of Classification Search ............. 174/110 R, 174/113 R, 117 R, 117 F, 117 FF, 36
See application file for complete search history.

(56) References Cited

U.S. PATENT DOCUMENTS

| | | | | |
|---|---|---|---|---|
| 3,168,617 A | * | 2/1965 | Richter | 174/117 FF |
| 4,149,026 A | * | 4/1979 | Fritz et al. | 174/32 |
| 4,356,345 A | * | 10/1982 | Gonia | 174/117 F |
| 4,381,208 A | * | 4/1983 | Baverstock | 156/52 |
| 4,486,253 A | * | 12/1984 | Gonia | 156/51 |
| 4,780,157 A | * | 10/1988 | Coon | 156/53 |
| 5,219,640 A | | 6/1993 | Gazit et al. | |
| 5,248,262 A | | 9/1993 | Busacco et al. | |
| 5,296,651 A | | 3/1994 | Gurrie et al. | |
| 5,359,150 A | * | 10/1994 | Ikeuchi | 174/117 F |
| 5,946,163 A | * | 8/1999 | Boutaghou et al. | 360/264.2 |
| 6,057,511 A | * | 5/2000 | Ikeda et al. | 174/110 R |
| 6,737,589 B2 | | 5/2004 | Adachi et al. | |
| 6,766,578 B1 | * | 7/2004 | Swanson et al. | 29/868 |
| 2002/0189854 A1 | | 12/2002 | Crumly | |

FOREIGN PATENT DOCUMENTS

| | | |
|---|---|---|
| JP | 10294565 | 11/1998 |
| JP | 11204898 | 7/1999 |

OTHER PUBLICATIONS

Zehnder, et al., "Reinforcing Effect of Coverlayers on the Fatigue Life of Copper-Kapton Flex Cables", *IEEE Transactions on Components, Packaging, and Manufacturing Technology Part B*, vol. 18, No. 4, (Nov. 1995),704-708.

* cited by examiner

*Primary Examiner*—William H Mayo, III

(57) ABSTRACT

Systems and methods for biasing a neutral axis of a flex cable in a hard drive are discussed. The hard drive comprises a flex cable, a read/write head, and a control card. The flex cable comprises a base film, adhesives, a conductive trace, a cover film, and a neutral axis. The neutral axis is configured to be biased so that stresses in the conductive trace are more compressive and less tensile than stresses without a biased neutral axis.

23 Claims, 8 Drawing Sheets

200

FLEX CABLE WITH BIASED NEUTRAL AXIS

TECHNICAL FIELD

Embodiments of the present technology relate generally to the field of cabling.

BACKGROUND

To reduce the size used to house a hard disk drive, hard disk drives are being made smaller. In turn, components within the hard disk drive are being made smaller. With the size reduction of components, new problems may arise, such as, conductive trace fatigue failure. Fatigue is the progressive and localized structural damage that occurs when a material is subjected to cyclic loading, such as bending. Conductive trace fatigue failure in a flex cable may result in false and/or failure of communications between a disk drive head and a control card. What is needed is a new approach to address conductive trace fatigue failure.

SUMMARY

Systems and methods for biasing a neutral axis of a flex cable in a hard drive are discussed herein. The hard drive comprises a flex cable, a read/write head, and a control card. The flex cable comprises a base film, adhesives, a conductive trace, a cover film, and a neutral axis. The neutral axis is configured to be biased so that stresses in the conductive trace are more compressive and less tensile than stresses without a biased neutral axis.

BRIEF DESCRIPTION OF THE DRAWINGS

The accompanying drawings, which are incorporated in and form a part of this specification, illustrate embodiments of the presented technology and, together with the description, serve to explain the principles of the presented technology.

The drawings referred to in this description should not be understood as being drawn to scale unless specifically noted.

DESCRIPTION OF EMBODIMENTS

Reference will now be made in detail to various embodiments of the present technology. While numerous specific embodiments of the present technology will be described in conjunction with the alternative embodiments, it will be understood that they are not intended to limit the present technology to these embodiments. On the contrary, these described embodiments of the present technology are intended to cover alternatives, modifications and equivalents, which may be included within the spirit and scope of the embodiments as defined by the appended claims.

Furthermore, in the following description of embodiments, numerous specific details are set forth in order to provide a thorough understanding of the present technology. However, it will be recognized by one of ordinary skill in the art that embodiments may be practiced without these specific details. In other instances, well known methods, procedures, components, and circuits have not been described in detail as not to unnecessarily obscure aspects of embodiments of the present technology.

Figure 1:
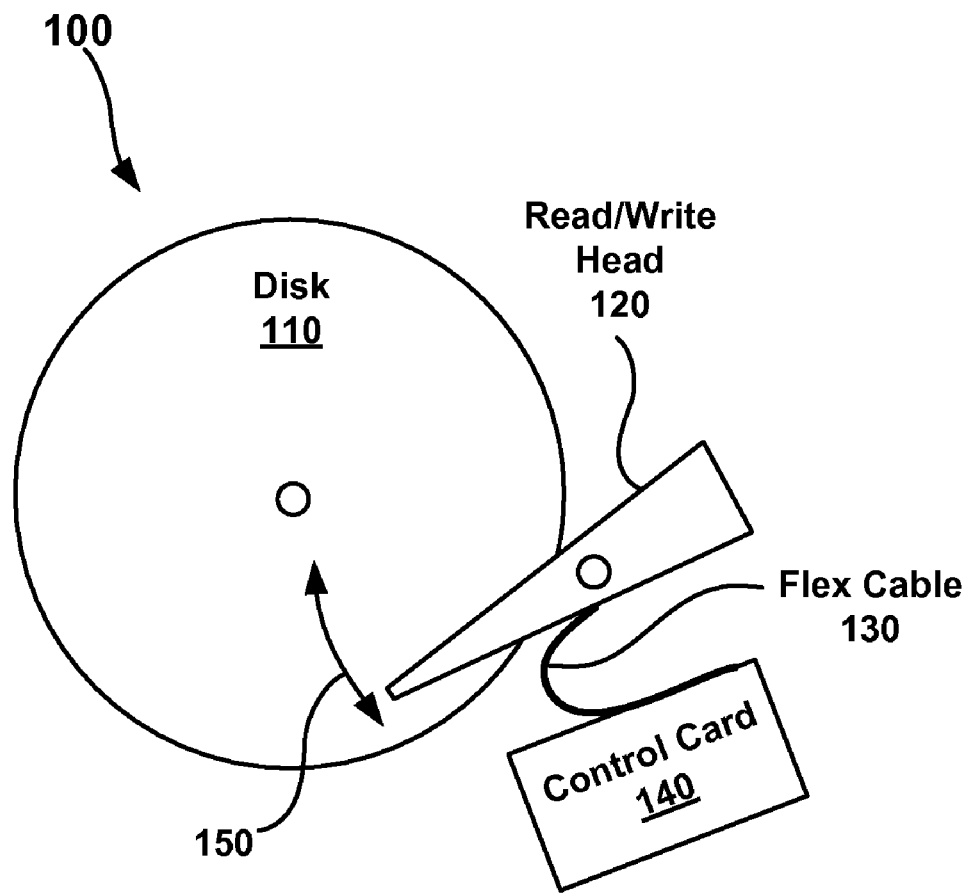
FIG. 1 is a top view of a hard disk drive in accordance with an embodiment of the present technology.

FIG. 1 is a top view of a hard disk drive 100 in accordance with an embodiment of the present technology. The hard disk drive 100 comprises a disk 110, a read/write head 120, a flex cable 130, and a control card 140. The read/write head 120 pivots along a path 150 when reading/writing information on the disk 110. When the read/write head 120 moves, the flex cable 130 flexes and remains coupled with the read/write head 120 and the control card 140. While the flex cable 130 flexes, conductive traces within the flex cable 130 undergo tensile stress. Flex cables are discussed further herein.

In other embodiments (not depicted), a read/write head may traverse in a direction parallel to the read/write head 120. A flex cable attached to a parallel traversing read/write head may undergo greater tensile stress as a range of motion for the flex cable may be longer.

Figure 2:
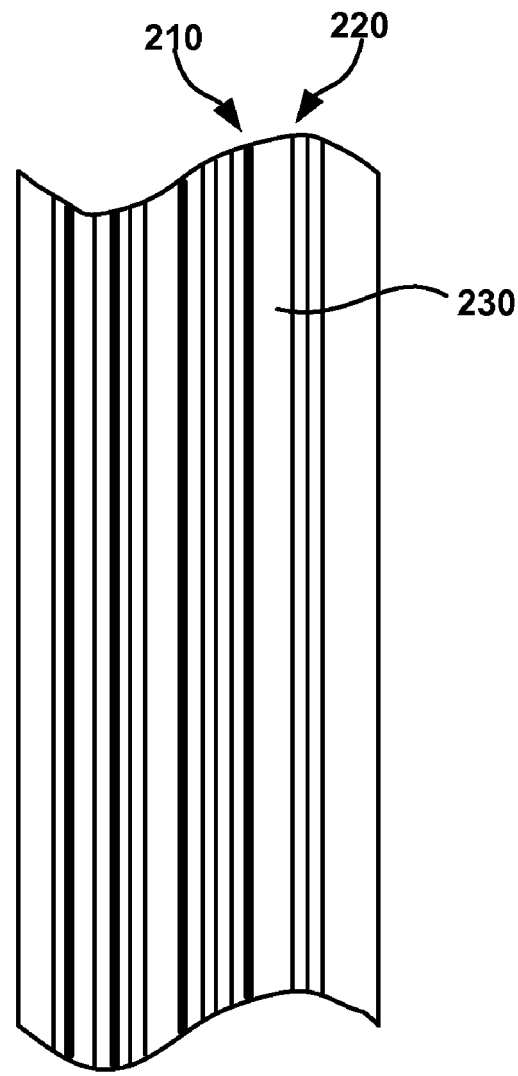
FIG. 2 is a side view of a flex cable of FIG. 1 in accordance with an embodiment of the present technology.

FIG. 2 is a side view of a flex cable 200 of FIG. 1 in accordance with an embodiment of the present technology. The flex cable 200 comprises one or more conductive traces, such as conductive trace 210 and conductive trace 220.

In various embodiments, during fabrication conductive traces are formed by lamination, patterning a trace, and etching the pattern. The fabrication process may electrically isolate conductive traces using spaces, such as space 230.

Conductive trace 210 and conductive trace 220 may have different thicknesses. As for flex cables, a thickness of the conductive trace is independent of the tensile stress as the tensile stress is perpendicular to the thickness. In some embodiments, actual failure of the conductive trace, however, may be mitigated with a thicker conductive trace. Unfortunately, thicker traces use more space. The conductive traces 210-220 may be made with copper, aluminum, gold, other conductive materials, such as an alloy, or some combination of conductive materials.

Figure 3:
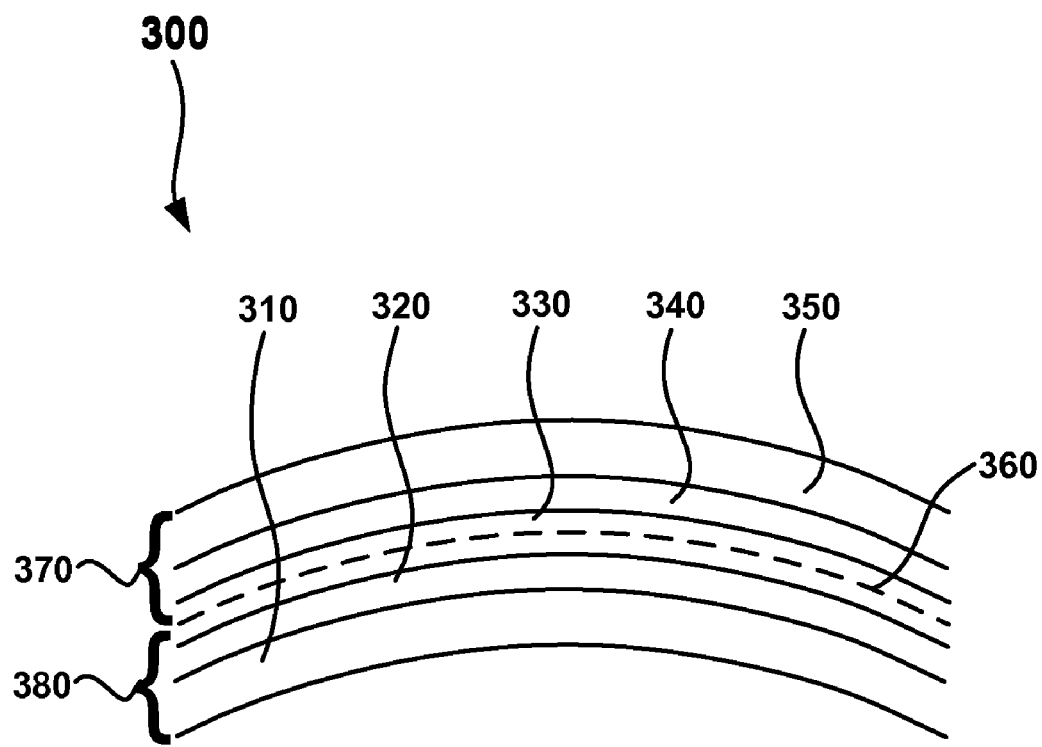
FIG. 3 is a top view of a flex cable showing an unbiased neutral (prior art).

FIG. 3 is a top view of a flex cable 300 showing an unbiased neutral (prior art). The flex cable 300 with an unbiased neutral axis comprises a base film 310, an adhesive B 320, a conductive trace 330, an adhesive C 340, a cover film 350, and an unbiased neutral axis 360. Typically, the base film 310 and the cover film 350 are made using a similar material. Also, the adhesive B 320 and the adhesive C 340 are made with using a similar material.

Typically, the base film 310 is a first layer of a flex cable. Typically, the adhesive B 320 and the adhesive C 340 are of similar materials. Typically, the cover film 350 is a final layer of the flex cable and is a similar material to the base film 310. The base film 310 and cover film 350 may comprise a plastic, such as Kapton HN or Upilex S.

The unbiased neutral axis 360 lies approximately in a center of the flex cable 300. A neutral axis is formed along an arc when a material is bent, for example, if a phone book is bent along the spine and a side opposite of the spine, a center page may reside along the neutral axis. A distance 370 represents a distance from the neutral axis to an outside of the cover film 350. A distance 380 represents a distance form the neutral axis to an outside of the base film 310. If stiffnesses of different layers of the material are homogenous and/or balanced, then the distances 370 and 380 may be similar. Balanced stiffnesses may be obtained using similar stiffnesses for both base film and cover film and similar stiffnesses for both adhesive B and adhesive C. In some embodiments, stiffnesses are adjusted by changing materials and/or doping materials.

Figure 4:
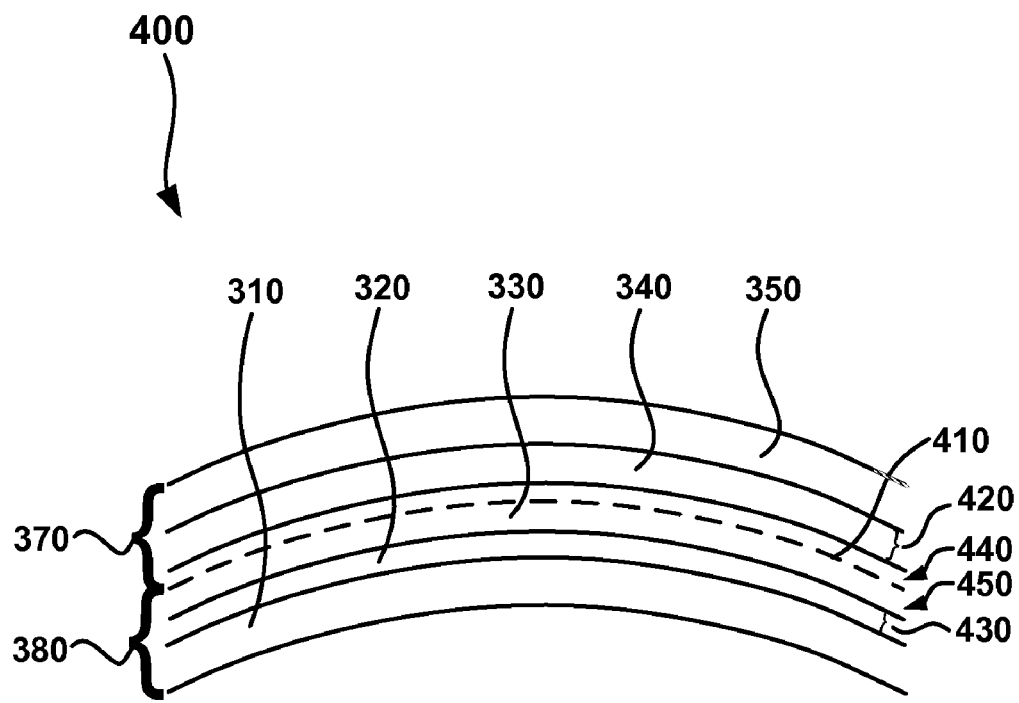
FIG. 4 is a top view of a flex cable showing a biased neutral using adhesive thickness differences in accordance with an embodiment of the present technology.

FIG. 4 is a top view of a flex cable 400 showing a biased neutral using adhesive thickness differences in accordance with an embodiment of the present technology. The flex cable 400 is similar to the flex cable 300. One difference is that the flex cable 400 has different thickness for the adhesive B 320, represented by thickness 420, and the adhesive C 340, represented by thickness 430. As thickness 420 is thicker than thickness 430, this biases a neutral axis 410 toward the cover film 350.

Biasing may be viewed regarding the conductive trace 330. The biased neutral axis 410 is no longer in the center of the conductive trace 330. That is, a distance 440 from the neutral axis to a side of the conductive trace 330 is shorter than a distance 450 from the neutral axis to another side of the conductive trace 330. The distances 370 and 380, however, have not changed, as the stiffnesses of the materials have not changed.

Biasing the neutral axis 410 toward the cover film 350 reduces a tensile stress of the conductive trace 330 on a cover film side, thereby improving a fatigue life of a flex cable. Changing the thickness of an adhesive layer may be performed at a later stage in a manufacturing of a flex cable rather than earlier stage, thus having an advantage of optimizing the flex cable for specific needs at a late stage.

Figure 5:
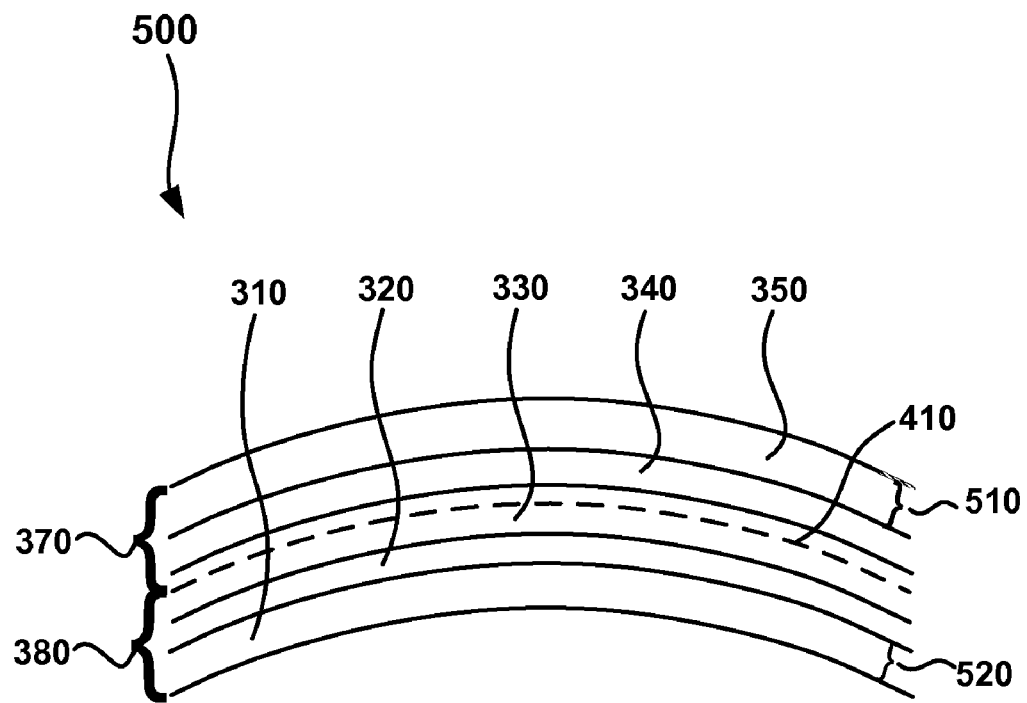
FIG. 5 is a top view of a flex cable showing a biased neutral using film thickness differences in accordance with an embodiment of the present technology.

FIG. 5 is a top view of a flex cable 500 showing a biased neutral using film thickness differences in accordance with an embodiment of the present technology. The flex cable 500 is similar to the flex cable 400, except that the thickness of the base film 310 and the cover film 350 are different rather than the thickness of the adhesives, with respect to the flex cable 300. This may be represented by have a thickness 510 thicker than a thickness 520.

Figure 6:
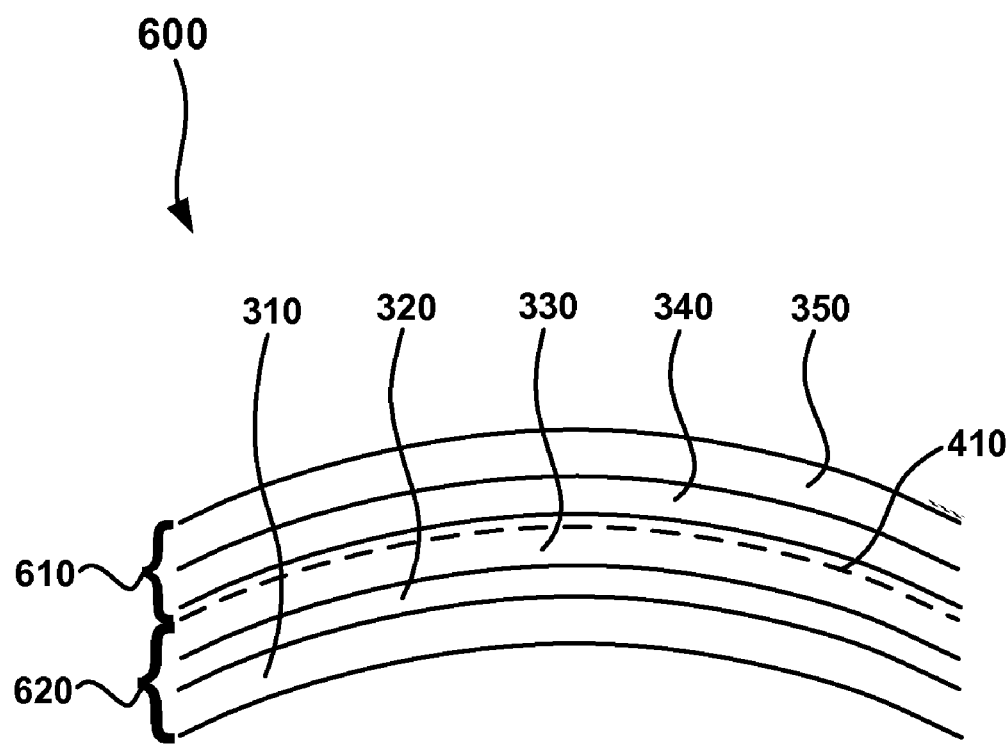
FIG. 6 is a top view of a flex cable showing a biased neutral using density differences in accordance with an embodiment of the present technology.

FIG. 6 is a top view of a flex cable 600 showing a biased neutral using stiffness differences in accordance with an embodiment of the present technology. Flex cable 600 is visually similar to flex cable 300. A difference is a difference in stiffnesses in one or more of the materials to provide a biased neutral axis 410. For example, if a stiffness of the adhesive C 340 is greater than a stiffness of the adhesive B 320, than the neutral axis will bias toward the cover film 350. In another example, a stiffness of the cover film 350 may be greater than a stiffness of the base film 310 to bias the neutral axis. In some embodiments, thicknesses of one or more layers and/or stiffnesses of one or more layers are adjusted to bias a neutral axis.

Figure 7:
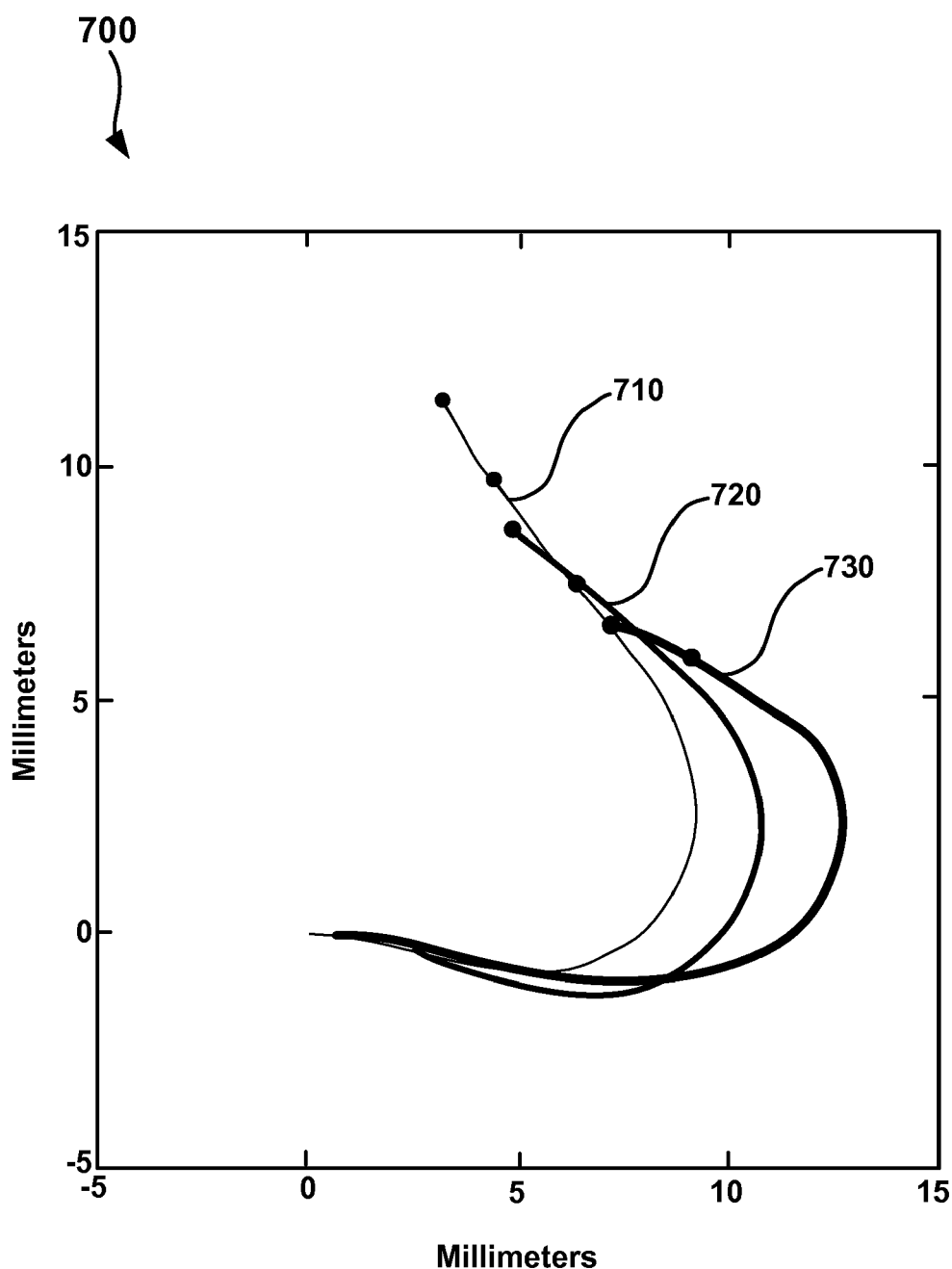
FIG. 7 is a graph illustrating a stroke usage of a flex cable in accordance with an embodiment of the present technology.

FIG. 7 is a graph 700 illustrating a stroke usage of a flex cable in accordance with an embodiment of the present technology. The graph 700 comprises an outer profile 710, a middle profile 720, and an inner profile 730. The outer profile 710 is a profile of the flex cable 130 when the read/write head 120 is near an outer diameter of the disk 110. The middle profile 720 is a profile of the flex cable 130 when the read/write head 120 is near a middle diameter of the disk 110. The inner profile 730 is a profile of the flex cable 130 when the read/write head 120 is near an inner diameter of the disk 110. As shown, conductive traces have tensile stresses on a side nearer to the cover film 350 for an entire stroke usage. With knowledge of the stroke usage, biasing the neutral axis nearer to the cover film 350 reduces tensile stress. In various embodiments, the neutral axis is biased based on the full stroke. In some embodiments, the neutral axis is biased based on an operational stroke. For example, a read/write head that mainly operates near an inner diameter of a disk may have more neutral axis biasing than a read/write head that mainly operates near an outer diameter of a disk.

Figure 8:
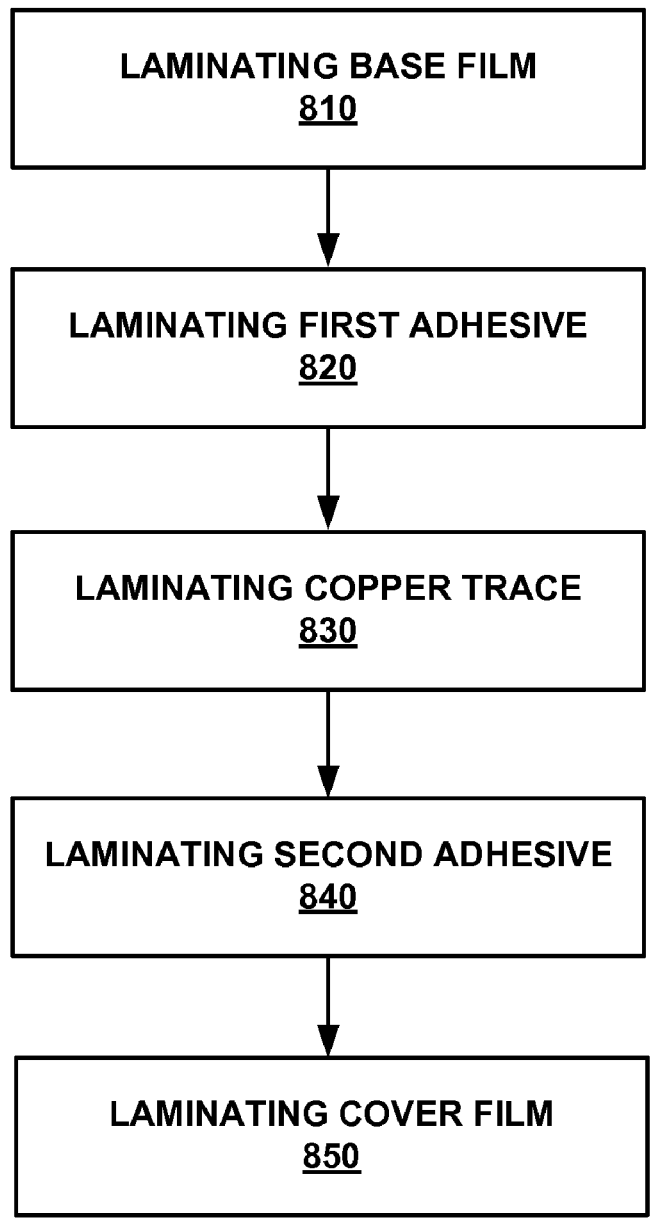
FIG. 8 is a flow diagram of an example method of manufacturing a flex cable with a biased neutral axis in accordance with an embodiment of the present technology.

FIG. 8 is a flow diagram of an example method of manufacturing a flex cable with a biased neutral axis in accordance with an embodiment of the present technology. In step 810, the base film 310 is laminated. In step 820, a first adhesive, such as adhesive B 320, is laminated.

In step 830, a conductive trace 330 is laminated. In some embodiments, the conductive trace 330 may be laminated by laminating a copper layer, patterning the conductive trace 330, and etching the pattern.

In step 840, a second adhesive is laminated. In some embodiments, the second adhesive has a greater stiffness than the first adhesive to yield the biased neutral axis 410. In other embodiments, the second adhesive is laminated with a greater thickness than the first adhesive to yield the biased neutral axis 410.

In step 850, the cover film 350 is laminated. In some embodiments, the cover film 350 has a greater stiffness than the base film 310 to yield the biased neutral axis 410. In other embodiments, the cover film 350 is laminated with a greater thickness than the base film 310 to yield the biased neutral axis 410.

In various embodiments, the combination of the second adhesive and the cover film 350 is thicker than the combination of the first adhesive and the base film 310 to yield the biased neutral axis 410. In other embodiments, the biased neutral axis 410 is obtained by combining different stiffnesses and/or thicknesses. For example, the second adhesive is stiffer than the first adhesive and the cover film 350 is thicker than the base film 310. One skilled in the art may note several combinations to yield a biased neutral axis 410 toward the cover film 350.

The foregoing descriptions of example embodiments have been presented for purposes of illustration and description. They are not intended to be exhaustive or to limit the teaching to the precise forms disclosed. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A flex cable comprising:
   a base film;
   a first adhesive coupled to the base film;
   a conductive trace coupled to the first adhesive;
   a second adhesive coupled to the conductive trace;
   a cover film coupled to the second adhesive; and
   a neutral axis, wherein the neutral axis is configured to be biased so that stresses in the conductive trace are more compressive and less tensile than stresses without a biased neutral axis.

2. The flex cable of claim 1, wherein the neutral axis is biased partially based on the first adhesive being thicker than the second adhesive.

3. The flex cable of claim 1, wherein the neutral axis is biased partially based on the base film layer being thicker than the cover film layer.

4. The flex cable of claim 1, wherein the neutral axis is biased partially based on a stiffness of the first adhesive being greater than a stiffness of the second adhesive.

5. The flex cable of claim 1, wherein the neutral axis is biased partially based on a stiffness of the base film being greater than a stiffness of the cover film.

6. The flex cable of claim 1, wherein the conductive trace comprises copper.

7. The flex cable of claim 1, wherein the neutral axis is biased based on an operational stroke.

8. A hard disk drive comprising:
   a flex cable comprising
      a base film,
      a conductive trace,
      a cover film, and
      a neutral axis, wherein the neutral axis is configured to be biased so that stresses in the conductive trace are more compressive and less tensile than stresses without a biased neutral axis;
   a read/write head coupled to the flex cable; and
   a control card coupled to the flex cable.

9. The hard disk drive of claim 8, further comprising a first layer of adhesive coupled to the base film and the conductive trace, and a second layer of adhesive coupled to the cover film and the conductive trace, wherein the neutral axis is biased partially based on the first layer being thicker than the second layer.

10. The hard disk drive of claim 8, wherein the neutral axis is biased partially based on the base film layer being thicker than the cover film layer.

11. The hard disk drive of claim 8, further comprising a first layer of adhesive coupled to the base film and the conductive trace, and a second layer of adhesive coupled to the cover film and the conductive trace, wherein the neutral axis is biased partially based on a stiffness of the first layer being greater than a stiffness of the second layer.

12. The hard disk drive of claim 8, wherein the neutral axis is biased partially based on a stiffness of the base film being greater than a stiffness of the cover film.

13. The hard disk drive of claim 8, wherein the bias is based on material stiffness differences.

14. The hard disk drive of claim 8, wherein the bias is based on material thickness differences.

15. The hard disk drive of claim 8, wherein the conductive trace comprises copper.

16. The hard disk drive of claim 8, wherein the neutral axis is biased based on an operational stroke.

17. A method of manufacturing a flex cable comprising:
    laminating a base film;
    laminating a first adhesive;
    laminating a conductive trace;
    laminating a second adhesive; and
    laminating a cover film,
    wherein the laminating of base film, the first adhesive, the second adhesive, and the cover film are configured to bias a neutral axis of the flex cable so that stresses in the conductive trace are more compressive and less tensile than stresses without a biased neutral axis.

18. The hard disk drive of claim 17, wherein the neutral axis is biased partially based on a layer of the first adhesive being thicker than a layer of the second adhesive.

19. The hard disk drive of claim 17, wherein the neutral axis is biased partially based on a layer of the base film layer being thicker than a layer of the cover film layer.

20. The hard disk drive of claim 17, wherein the neutral axis is biased partially based on a stiffness of the first adhesive being greater than a stiffness of the second adhesive.

21. The hard disk drive of claim 17, wherein the neutral axis is biased partially based on a stiffness of the base film being greater than a stiffness of the cover film.

22. The method of claim 17, wherein laminating the conductive trace comprises laminating a layer of copper, patterning the conductive trace, and etching the pattern.

23. The method of claim 17, wherein the neutral axis is biased based on an operational stroke.

\* \* \* \* \*